(12) United States Patent
Sakai et al.

(10) Patent No.: US 8,922,027 B2
(45) Date of Patent: Dec. 30, 2014

(54) ELECTRONIC DEVICE HAVING ELECTRODES BONDED WITH EACH OTHER

(71) Applicant: Fujitsu Limited, Kawasaki-shi, Kanagawa (JP)

(72) Inventors: Taiji Sakai, Yokohama (JP); Nobuhiro Imaizumi, Atsugi (JP)

(73) Assignee: Fujitsu Limited, Kawasaki-shi, Kanagawa (JP)

( * ) Notice: Subject to any disclaimer, the term of this patent is extended or adjusted under 35 U.S.C. 154(b) by 0 days.

(21) Appl. No.: 13/671,970

(22) Filed: Nov. 8, 2012

(65) Prior Publication Data

US 2013/0187293 A1 Jul. 25, 2013

(30) Foreign Application Priority Data

Jan. 20, 2012 (JP) ................................. 2012-009728
Jul. 3, 2012 (JP) ................................. 2012-149410

(51) Int. Cl.
| | | |
|---|---|---|
| H01L 23/48 | (2006.01) | |
| H01L 23/52 | (2006.01) | |
| H01L 29/40 | (2006.01) | |
| H01L 23/12 | (2006.01) | |
| H01L 23/00 | (2006.01) | |
| H01L 23/488 | (2006.01) | |
| G21K 5/02 | (2006.01) | |
| H01L 21/67 | (2006.01) | |
| H01L 21/762 | (2006.01) | |

(52) U.S. Cl.
CPC . *H01L 21/76254* (2013.01); *H01L 2224/13147* (2013.01); *H01L 2224/16227* (2013.01); *H01L 2224/81013* (2013.01); *H01L 24/81* (2013.01); *H01L 2224/13082* (2013.01); *H01L 2224/8109* (2013.01); *H01L 2224/97* (2013.01); *H01L 2224/81075* (2013.01); *H01L 2224/83192* (2013.01); *H01L 2224/75251* (2013.01);

(Continued)

(58) Field of Classification Search
USPC ......... 257/778, 777, 779, 780, 781, 782, 786, 257/733
See application file for complete search history.

(56) References Cited

U.S. PATENT DOCUMENTS

| | | |
|---|---|---|
| 6,591,495 B2 | 7/2003 | Hirose |
| 7,415,761 B2 | 8/2008 | Hirose |

(Continued)

FOREIGN PATENT DOCUMENTS

| | | |
|---|---|---|
| JP | H4-309474 | 11/1992 |
| JP | H5-131279 | 5/1993 |
| JP | 2000-261149 | 9/2000 |

OTHER PUBLICATIONS

Taiwanese Office Action dated Sep. 25, 2014 in the corresponding Taiwanese patent application No. 101141742, with English translation.

*Primary Examiner* — Matthew Reames
*Assistant Examiner* — Dinlinh Nguyen
(74) *Attorney, Agent, or Firm* — Kratz, Quintos & Hanson, LLP

(57) ABSTRACT

According to this disclosure, a method of manufacturing an electronic device is provided, which includes exposing a top surface of a first electrode of a first electronic component to organic acid, irradiating the top surface of the first electrode exposed to the organic acid with ultraviolet light, and bonding the first electrode and a second electrode of a second electronic component by heating and pressing the first electrode and the second electrode each other.

1 Claim, 19 Drawing Sheets

(52) U.S. Cl.
CPC ............... *H01L 2224/81054* (2013.01); *H01L 2224/11845* (2013.01); *H01L 2224/16145* (2013.01); *H01L 2224/1184* (2013.01); *H01L 2224/13111* (2013.01); *H01J 2224/81203* (2013.01); *H01L 2224/1182* (2013.01); H01L 23/488 (2013.01); H01L 24/13 (2013.01); *H01L 2224/818* (2013.01); *H01L 2224/118* (2013.01); G21K 5/02 (2013.01); *H01L 2224/81014* (2013.01); *H01L 2224/8101* (2013.01); H01L 21/67144 (2013.01); *H01L 2224/81193* (2013.01); H01L 21/67092 (2013.01); *H01L 2224/7598* (2013.01); *H01L 2224/81002* (2013.01); *H01L 2224/16501* (2013.01); H01L 24/11 (2013.01); *H01L 2224/9211* (2013.01); H01L 24/16 (2013.01); *H01L 2224/8102* (2013.01); H01L 21/67017 (2013.01); *H01L 2224/11462* (2013.01); *H01L 2224/81986* (2013.01)

USPC ........... 257/778; 257/733; 257/777; 257/779; 257/780; 257/781; 257/782; 257/786

(56) References Cited

U.S. PATENT DOCUMENTS

| | | | |
|---|---|---|---|
| 7,832,098 B2 | 11/2010 | Hirose | |
| 8,148,643 B2 | 4/2012 | Hirose | |
| 2007/0008051 A1 | 1/2007 | Tsuda et al. | 333/193 |
| 2010/0052162 A1* | 3/2010 | Iijima | 257/737 |
| 2012/0125680 A1 | 5/2012 | Hirose | |

* cited by examiner

ELECTRONIC DEVICE HAVING ELECTRODES BONDED WITH EACH OTHER

CROSS-REFERENCE TO RELATED APPLICATION(S)

This application is based upon and claims the benefit of priority of the prior Japanese Patent Application No. 2012-9728, filed on Jan. 20, 2012, and Japanese Patent Application No. 2012-149410, filed on Jul. 3, 2012, the entire contents of which are incorporated herein by reference.

FIELD

The embodiments discussed herein are related to an electronic device, a method of manufacturing the electronic device, and an electronic device manufacturing apparatus.

BACKGROUND

Flip-chip mounting is one of the methods of mounting a semiconductor element on a circuit board. In the flip-chip mounting, the circuit board and the semiconductor element are electrically and mechanically connected to each other by reflowing and connecting solder bumps formed on the surfaces of the circuit board and semiconductor element.

As the solder bumps are miniaturized, the distances between the adjacent solder bumps get shorter. This can cause an electrical short circuit between the bumps which are melted by reflow. Moreover, as the solder bumps are reduced in diameter with the miniaturization, the density of current flowing through the solder bumps increases. This can notably cause electromigration in which the solder material flows along the current.

To avoid such problems, instead of using the connection method using solder bumps, there is proposed a method in which the electrodes, such as copper bumps, are bonded by performing thermocompression bonding on the electrodes, thereby causing solid phase diffusion of the metal materials in the electrodes. This bonding method is also referred to as solid-phase diffusion bonding.

In the solid-phase diffusion bonding, unlike the connecting method using solder bumps, it is unnecessary to melt electrodes by reflow. Therefore, even when the distances between the adjacent electrodes are reduced, the electrodes cannot be electrically short-circuited. The solid-phase diffusion bonding is therefore advantageous to miniaturization of electronic devices.

However, in the process of the solid-phase diffusion bonding, to promote diffusion of atoms between the electrodes, high temperature and high pressure are applied to semiconductor elements. This can damage the semiconductor elements.

The technologies related to the following disclosure are disclosed in Japanese Patent Laid-open Publications No. 04-309474 and No. 05-131279.

SUMMARY

According to one aspect discussed herein, there is provided a method of manufacturing an electronic device, the method including exposing a top surface of a first electrode of a first electronic component to organic acid, irradiating the top surface of the first electrode exposed to the organic acid with ultraviolet light, and bonding the first electrode and a second electrode of a second electronic component by heating and pressing the first electrode and the second electrode each other.

According to another aspect discussed herein, there is provided an electronic device including a first electronic component including a first electrode, and a second electronic component including a second electrode bonded to the first electrode, wherein a crystal layer is formed between the first electrode and the second electrodes.

According to a still another aspect discussed herein, there is provided an electronic device manufacturing apparatus including a chamber, a stage which is provided in the chamber and on which an electronic component having an electrode is placed, and an ultraviolet lamp provided in the chamber and configured to irradiate the electrode with ultraviolet light, wherein the ultraviolet lamp is provided at a position where the ultraviolet lamp is capable of irradiating a top surface of the electrode with the ultraviolet light According to a yet another aspect discussed herein, there is provided an electronic device manufacturing apparatus including a first chamber in which an oxidized film is removed from a surface of at least one of a first electrode included in a first electronic component and a second electrode included in a second electronic component, a second chamber which is connected to the first chamber and in which at least one of the first electrode and the second electrode is irradiated with ultraviolet light, a bonder connected to the second chamber and configured to align the first electrode and the second electrode, and a third chamber which is connected to the bonder and in which the first electronic component and the second electronic component are heated and pressed against each other.

The object and advantages of the invention will be realized and attained by means of the elements and combinations particularly pointed out in the claim.

It is to be understood that both the forgoing general description and the following detailed description are exemplary and explanatory and are not restrictive of the invention.

DESCRIPTION OF EMBODIMENTS

Prior to the description of embodiments, preliminary matters are described.

Figure 1:
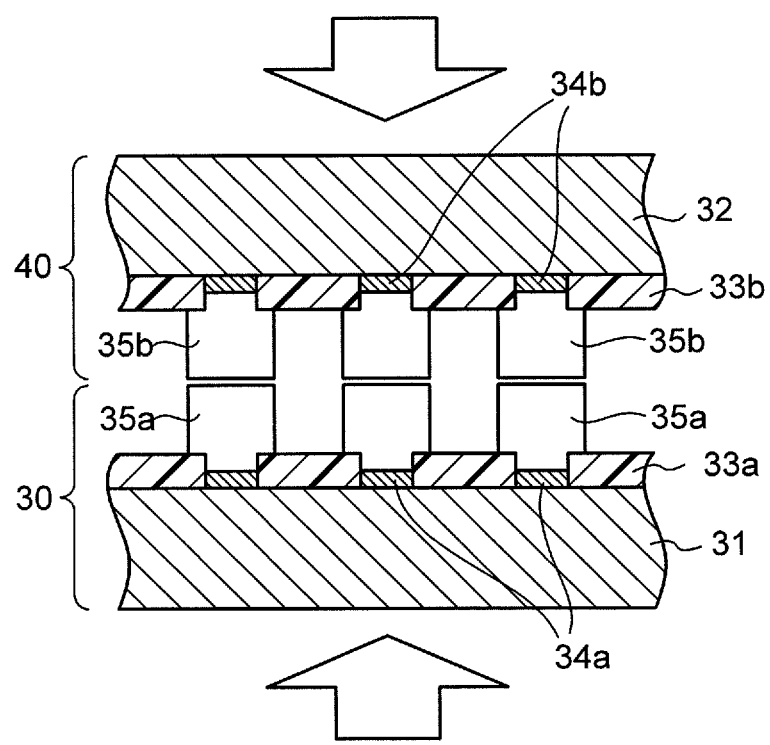
FIG. 1 is a cross-sectional view illustrating a process to bond electronic components by solid-phase diffusion bonding.

FIG. 1 is a cross-sectional view illustrating a process to bond electronic components by solid-phase diffusion bonding.

In this example, the description is given of a case of bonding a first electronic component 30 and a second electronic component 40.

Among these electronic components, the first electronic component 30 is a circuit board. The first electronic component 30 includes first electrode pads 34a and first passivation films 33a, which are formed on a surface of a first silicon substrate 31.

On the first electrode pads 34a, columnar first electrodes 35a made of copper are formed by electroplating. The columnar electrodes are also called bump electrodes or post electrodes.

On the other hand, the second electronic component 40 is a semiconductor element. The second electronic component 40 includes second electrode pads 34b and second passivation films 33b, which are formed on a surface of a second silicon substrate 32. On the second electrode pads 34b, columnar second electrodes 35b made of copper are formed by electroplating.

The size of the second electrodes 35b is not particularly limited. In this example, each second electrode 35b has a shape of a square in a plan view, whose sides is about 10 μm.

Then, the first electrodes 35a and second electrodes 35b are aligned with each other by an unillustrated flip-chip bonder in a state where the second electronic component 40 in a face down state is opposed to the first electronic component 30.

To facilitate the alignment, it is preferable that the first electrodes 35a are larger than the second electrodes 35b. In this example, each first electrode 35a has a shape of a square in a plan view whose sides is about 15 μm.

Figure 2A:
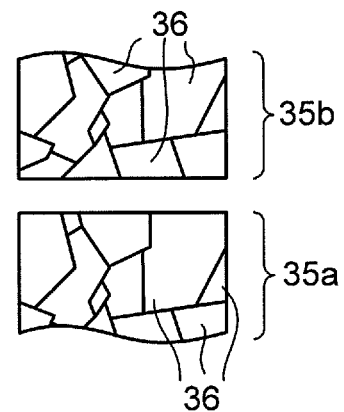
FIGS. 2A to 2C are enlarged cross-sectional views in process of bonding first and second electrodes.
Figure 2B:
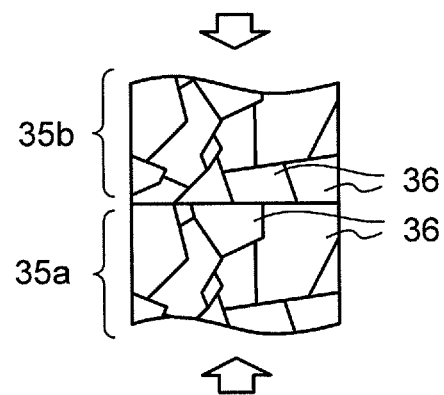
Figure 2C:
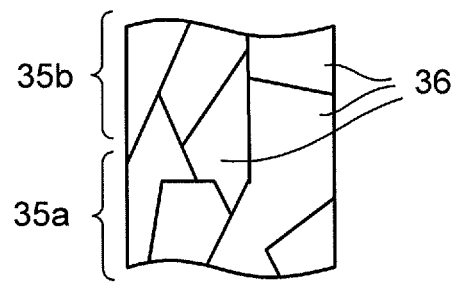

FIGS. 2A to 2C are enlarged cross-sectional view illustrating the first electrode 35a and the second electrode 35b of FIG. 1 in a process of bonding.

As illustrated in FIG. 2A, before bonding, each of the first and second electrodes 35a and 35b includes a plurality of copper crystal grains 36. Then, the top surfaces of the first and second electrodes 35a and 35b are flattened by CMP (chemical mechanical polishing) in advance so as to ensure the adhesion therebetween. By the CMP, the aforementioned crystal grains 36 are exposed in the top surfaces of the first and second electrodes 35a and 35b.

Next, as illustrated in FIG. 2B, the first and second electrodes 35a and 35b are heated by the aforementioned flip-chip bonder while being pressed against each other.

Here, when the heating temperature is low or the pressing load is small in this process, the crystal grains 36 become discontinuous at the boundary between the first and second electrodes 35a and 35b, and these electrodes 35a and 35b can be easily separated from each other. Accordingly, in order to merge the crystal grains 36 at the boundary, in this process, the first and second electrodes 35a and 35b are heated to a temperature higher than the recrystallization temperature of the crystal grains 36 of copper and are also sufficiently pressed against each other with a load larger than 20 gf per bump.

By heating and pressing on the above conditions, the crystal grains 36 around the boundary between the first and second electrodes 35a and 35b are merged as illustrated in FIG. 2C, thus allowing the first and second electrodes 35a and 35b to be mechanically firmly connected.

However, by using this method, the first and second electronic components 30 and 40 could be damaged by the high temperature of 300° C. and the load higher than 20 gf as described above.

Hereinbelow, a description is given of embodiments with reference to the accompanying drawings.

First Embodiment

Figure 3:
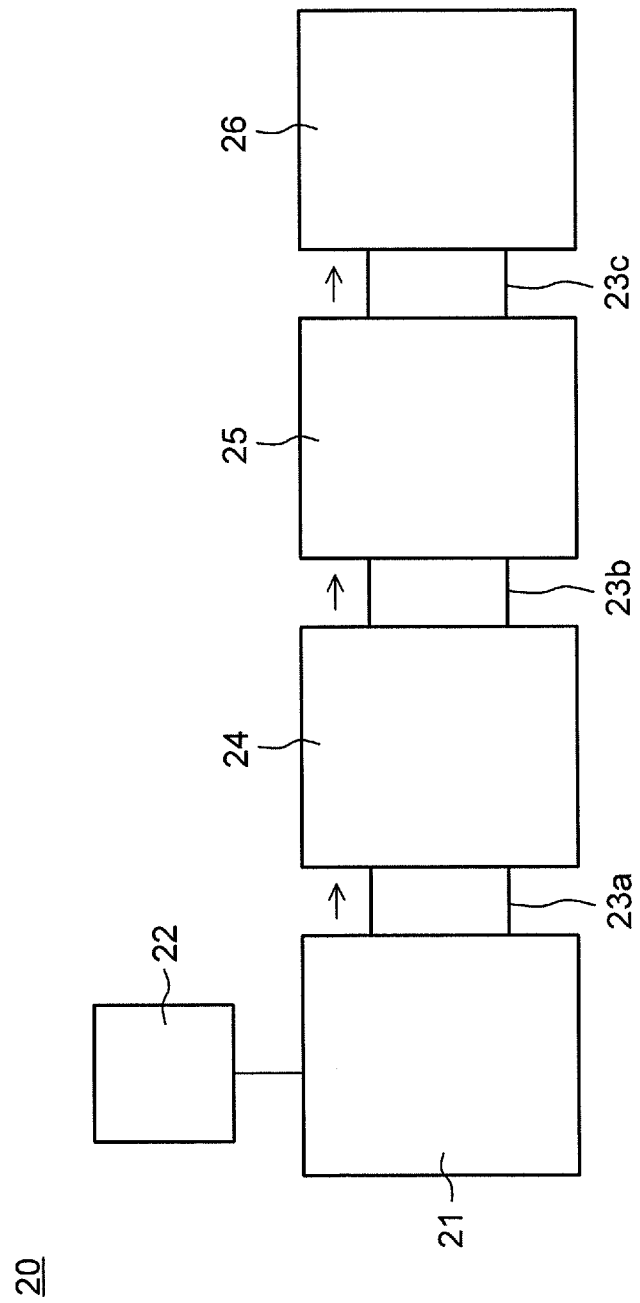
FIG. 3 is a configuration view of an electronic device manufacturing apparatus used in a first embodiment.

FIG. 3 is a configuration view of an electronic device manufacturing apparatus used in a first embodiment.

An electronic device manufacturing apparatus 20 according to the first embodiment includes a first chamber 21, a second chamber 24, a flip-chip bonder 25, and a third chamber 26 and further includes transfer units 23a to 23c therebetween.

The first chamber 21 is connected to an organic acid supply unit 22 and is supplied with gas containing organic acid. The first, second, and third chambers 21, 24, and 26 are individually connected to unillustrated vacuum pumps and can be depressurized.

Between the first to third chambers 21, 24, and 26 and the respective transfer units 23a to 23c, unillustrated valves are provided to keep airtight in the first to third chambers 21, 24, and 26.

In the first embodiment, by using the electronic device manufacturing apparatus 20, the first and second electronic components 30 and 40, which are illustrated in FIG. 1, are electrically and mechanically connected to each other in the following manner.

FIGS. 4A to 4K are cross-sectional views of the electronic device in process of manufacture according to the first embodiment.

Figure 4A:
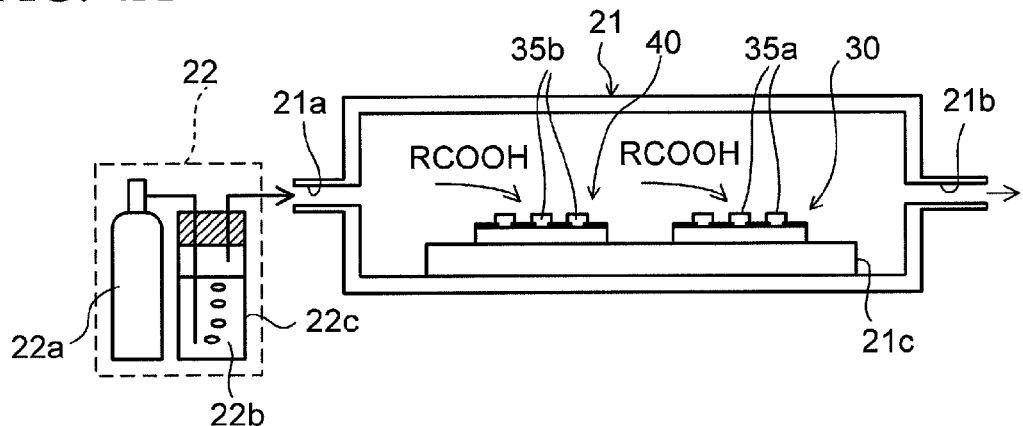
FIGS. 4A to 4K are cross sectional views of the electronic device in process of manufacture according to the first embodiment.

As illustrated in FIG. 4A, the first and second electronic components 30 and 40 are placed on a stage 21c within the first chamber 21.

In the example described below, the first and second electronic components 30 and 40 are chips diced from wafers. However, the following process may be performed for wafers. Moreover, the following process may be performed in a state where one of the first and second electronic components 30 and 40 is a wafer and the other electronic component is a chip diced from a wafer.

Then, in this state, while supplying the gas containing organic acid into the first chamber from a gas inlet 21a, extra gas within the first chamber 21 is discharged out from a gas outlet 21b.

The gas to be introduced into the first chamber 21 is generated at the organic acid supply unit 22. The organic acid supply unit 22 includes a tank 22a charged with inert gas such as nitrogen, and a vessel 22c accommodating liquid organic acid 22b. The organic acid supply unit 22 generates gas containing organic acid by bubbling the inert gas.

Although not particularly limited, formic acid is used as the organic acid in the present embodiment. Instead of formic acid, the organic acid may be carboxylic acid such as acetic acid or oxalic acid.

Figure 4B:
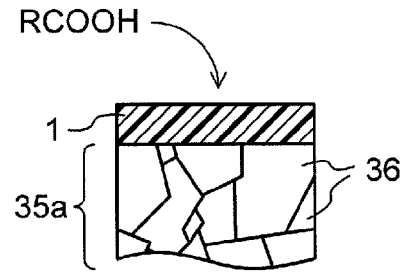

As illustrated in FIG. 4B, just before being exposed to the organic acid, the top surface of the first electrode 35a includes an oxidized copper film 1 with a thickness of 5 nm to 10 nm because copper is naturally oxidized. Instead of the naturally oxidized film, a thermally oxidized copper film may be formed as the oxidized film 1 to a thickness larger than the naturally oxidized film, for example, to a thickness of about 10 nm to 150 nm.

When the top surface of the first electrode 35a with the oxidized film 1 is exposed to formic acid, any one of the reactions expressed by the following chemical formulas (1) and (2) proceeds depending on the composition of the oxidized film 1.

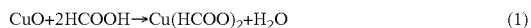  (1)

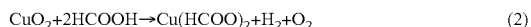  (2)

Figure 4C:
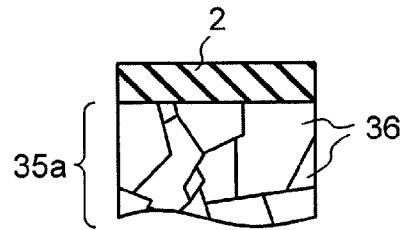

By these reactions, as illustrated in FIG. 4C, an organic acid metal film 2 containing copper formate is formed on the top surface of the first electrode 35a.

To advance the aforementioned reaction more quickly, it is preferable that the first electrodes 35a be heated to about 120° C. by an unillustrated heater incorporated in the first chamber 21.

In the first embodiment, as described later, an altered layer of copper, which includes an amorphous copper layer or a microcrystalline copper layer, is formed from the organic acid metal film 2. Accordingly, in order not to prevent formation of the altered layer of copper, it is preferable that the heating temperature at this process is lower than 130° C. which is a recrystallization temperature of amorphous or microcrystalline copper.

The pressure within the first chamber 21 is not particularly limited too. However, when the oxidized film 1 is a naturally-oxidized film, the oxidized film 1 is thin and therefore can be entirely formed into the organic acid metal film 2 even at reduced pressure. In the first embodiment, the pressure within the first chamber 21 is set to a reduced pressure of about 600 mTorr, and the process is carried out for 30 min.

On the other hand, when the oxidized film 1 is a thermally-oxidized film thicker than the naturally-oxidized film, entire oxidized film 1 can be surely formed into the organic acid metal film 2 by exposing the oxidized film 1 to formic acid at a pressure higher than atmospheric pressure.

Note that the organic acid metal film 2 is also formed on the top surface of the second electrode 35b (see FIG. 4A) by the same reaction as in the above.

Figure 4D:
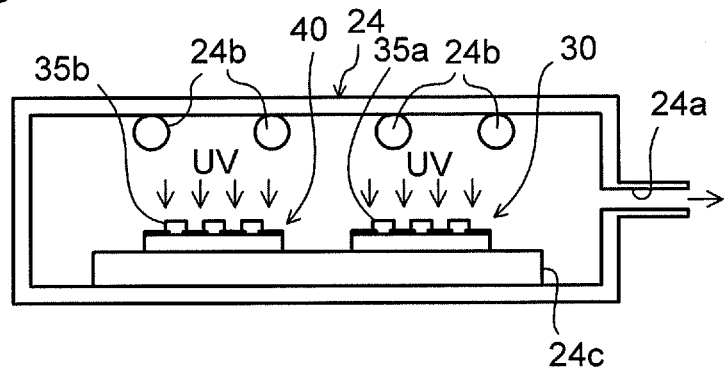

Next, as illustrated in FIG. 4D, the first and second electronic components 30 and 40 are transferred to the second chamber 24 using the transfer unit 23a (see FIG. 3).

As illustrated in FIG. 4D, the second chamber 24 includes ultraviolet lamps 24b and a stage 24c. The first and second electronic components 30 and 40 are placed on the stage 24c with the electrodes 35a and 35b being face up.

Thus, the top surfaces of the first and second electrodes 35a and 35b are exposed to ultraviolet light generated by the ultraviolet lamps 24b.

The light sources of the ultraviolet lamps 24b are not particularly limited. However, in order to efficiently decompose copper formate in the organic acid metal film 2, it is preferable that each ultraviolet lamp 24b is an excimer lamp with a wavelength shorter than wavelength allowing decomposition of copper formate, for example, an excimer lamp with a wavelength of 172 nm. Note that the ultraviolet light with this wavelength is also called vacuum ultraviolet (VUV) light.

Figure 4E:
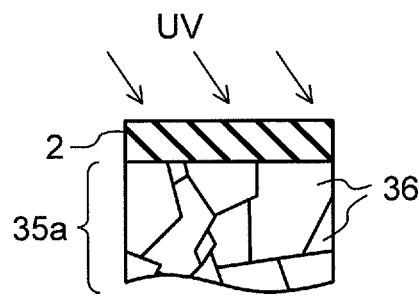

The organic acid metal film 2 is irradiated with the aforementioned ultraviolet light as illustrated in FIG. 4E. The organic acid metal film 2 is therefore decomposed in accordance with the following chemical formula (3).

  (3)

Figure 4F:
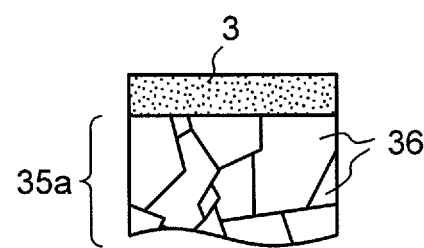

By this reaction, as illustrated in FIG. 4F, the altered layer 3 of copper, which contains non-crystalline amorphous or microcrystalline copper, is formed in the top surface of the first electrode 35a.

Irradiation time of the ultraviolet is not particularly limited. In the present embodiment, the irradiation time of the ultraviolet is about 5 min to 15 min.

Furthermore, in order to promote the decomposition reaction by the chemical formula (3), it is preferable that the first electrodes 35a be heated at a temperature ranging from about room temperature (20° C.) to about 150° C.

The recrystallization temperature of the amorphous or microcrystalline altered layer 3 is 130° C. Therefore, when this process is performed at a temperature higher than 130° C., the altered layer 3 is recrystallized. Accordingly, it is preferable that the heating temperature of the first electrodes 35a during the ultraviolet irradiation is a temperature below 130° C. of the recrystallization temperature of amorphous or microcrystalline copper, for example, about 120° C.

In the top surface of each second electrode 35b, an altered layer 3 of copper is formed by the same processes as those illustrated in FIGS. 4A to 4F.

Figure 4G:
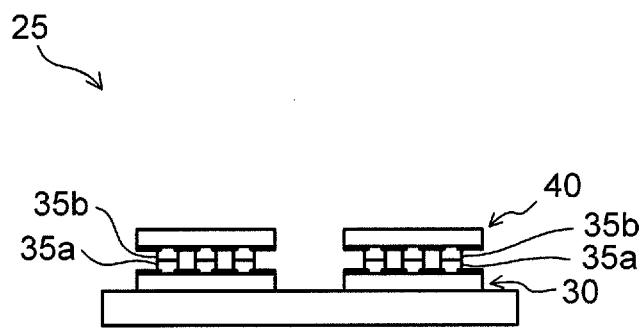

Thereafter, as illustrated in FIG. 4G, the first and second electronic components 30 and 40 are transferred to the flip-chip bonder 25 (see FIG. 3). In the flip-chip bonder 25, the first and second electrodes 35a and 35b are aligned with each other, and then the first and second electrodes 35a and 35b are heated to 100° C. and pressed with a load of 5 gf to 10 gf per electrode for temporary bonding.

Figure 4H:
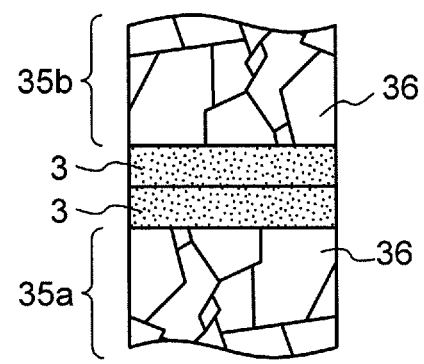

FIG. 4H is an enlarged cross-sectional view after this process is completed. As illustrated in FIG. 4H, just after the temporary bonding, the altered layers 3 of the first and second electrodes 35a and 35b are not merged with each other.

Preferably, the surfaces of the altered layers 3 of the first and second electrodes 35a and 35b are exposed to ultraviolet light before the temporary bonding, so as to decompose and remove organic substances on the surfaces of the altered layer 3 and thus cleaning the surfaces. Note that the organic substances may be oxidized and removed by exposing the altered layers 3 to oxygen plasma instead of ultraviolet light.

By removing the organic substances in such a manner, it is possible to prevent the bond strength between the first and second electrodes 35a and 35b from decreasing due to the organic substances.

To promote cleaning, the first and second electrodes 35a and 35b may be heated to a temperature higher than the room temperature during the ultraviolet or oxygen plasma irradiation. However, in order to prevent recrystallization of the altered layers 3, it is preferable that the upper limit of the temperatures of the first and second electrodes 35a and 35b at the heating is set lower than 130° C. of the recrystallization temperature of amorphous or microcrystalline copper in the altered layers 3, for example, set to about 120° C.

Figure 4I:
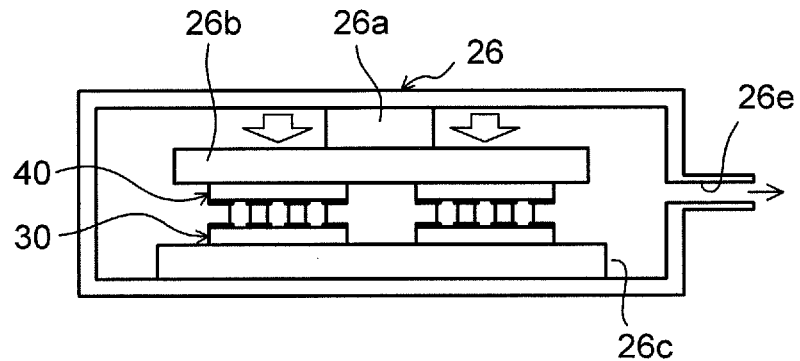

Next, as illustrated in FIG. 4I, the first and second electronic components 30 and 40 temporarily bonded to each other are transferred into the third chamber 26.

As illustrated in FIG. 4I, the third chamber 26 includes a stage 26c on which the first and second electronic components 30 and 40 are placed, and a press plate 26b provided opposite to the stage 26c.

A press unit 26a is connected to the press plate 26b. By the load from the press unit 26a, the first and second electronic components 30 and 40 located between the press plate 26b and the stage 26c are pressed. The pressing load is not particularly limited. However, in the first embodiment, the pressing load is 10 gf per electrode, for example.

At the same time, the first and second electronic components 30 and 40 are heated at a temperature of 150° C. to 250° C., which is higher than the recrystallization temperature of the altered layers 3, for about 10 min to 30 min. This heating is performed by an unillustrated heater incorporated in the stage 26c.

Figure 4J:
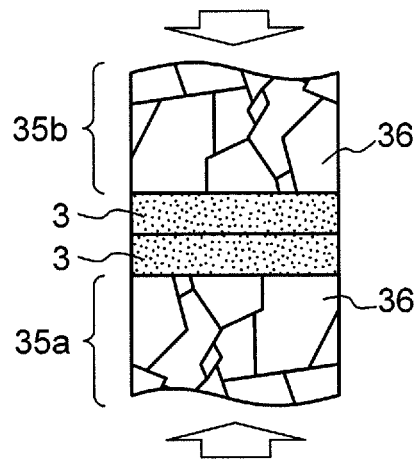

FIG. 4J is a cross-sectional view of the first and second electrodes 35a and 35b just after pressing is started in the aforementioned manner.

As illustrated in FIG. 4J, the altered layers 3 in the top surfaces of the first and second electrodes 35a and 35b are soft, and hence the altered layers 3 can easily be deformed with a load less than that of FIG. 1. Thus, the altered layers 3 come into close contact with no gap.

In particular, in the case where the oxidized films 1 (see FIG. 4B) are thermally-oxidized films, the altered layers 3 are thick enough and can be easily deformed. This can implement better close contact between the first and second electrodes 35a and 35b.

Moreover, in this process, since the altered layers 3 are heated at a temperature higher than the recrystallization temperature of the altered layers 3, crystals of copper grow while the boundary portions of the altered layers 3 are merged with each other.

Figure 4K:
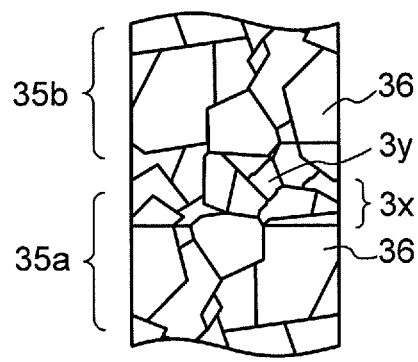

As the result, as illustrated in FIG. 4K, the altered layers 3 turn into a copper crystal layer 3x, through which the first and second electrodes 35a and 35b are mechanically firmly bonded to each other.

Here, in the crystal layers 3x formed by crystallizing amorphous or microcrystalline copper, the size of the copper crystalline grains is smaller than that of the first and second electrodes 35a and 35b. In the case of the present embodiment, the copper crystalline grains 36 in the first and second electrodes 35a and 35b have an average diameter of about 5 µm, while the copper crystalline grains 3y in the crystal layers 3x have a smaller average diameter of about 1 µm to 3 µm.

Furthermore, in the interface between the first electrode 35a and the crystal layer 3x, the orientations of the copper crystalline grains in the electrode 35a and layer 3x become discontinuous in some cases. Such a state occurs also in the interface between the second electrode 35b and the crystal layer 3x.

Note that the oxidized films in the surfaces of the first and second electrodes 35a and 35b may be removed in advance by exposing the top surfaces of the first and second electrodes 35a and 35b to gas containing organic acid such as formic acid before the first and second electrodes 35a and 35b are bonded in the aforementioned manner.

This can inhibit the formation of oxidized film in the bonding interface between the first and second electrodes 35a and 35b, and therefore prevent that the bonding of the first and second electrodes 35a and 35b is inhibited due to the oxidized film.

Moreover, in order to further reduce the risk that the oxidized film is formed in the bonding interface, the first and second electrodes 35a and 35b may be bonded within the third chamber 26 that is configured to have an atmosphere from which oxygen is excluded. Such an atmosphere is, for example, inert gas atmosphere or a vacuum atmosphere.

Note that the atmosphere within the third chamber 26 may be an atmosphere containing organic acid such as formic acid. The organic acid can prevent formation of oxidized film in the bonding interface between the first and second electrodes 35a and 35b.

The basic process of the method of manufacturing the electronic device according to the first embodiment is thus completed.

Figure 5:
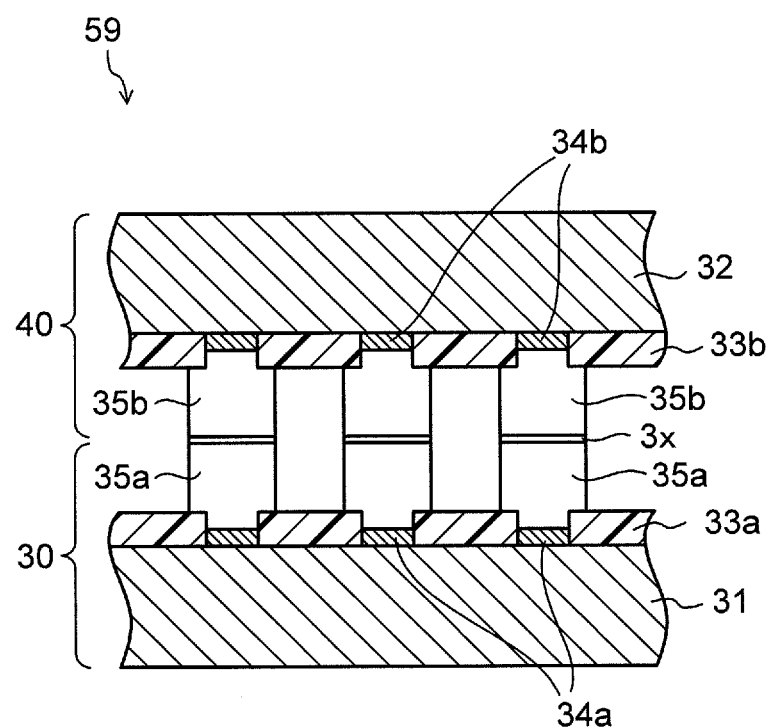
FIG. 5 is a cross-sectional view of an electronic device manufactured in the first embodiment.

FIG. 5 is a cross-sectional view of an electronic device 59 manufactured in the aforementioned manner.

According to the present embodiment, the first and second electrodes 35a and 35b are bonded via the altered layers 3 of copper which has a lower recrystallization temperature and is softer than crystallized copper. Accordingly, compared with the case of not forming the altered layers 3, the heating temperature and load applied to the first and second electrodes 35a and 35b can be reduced, and the first and second electrodes 35a and 35b can be bonded in a shorter time.

This can reduce thermal and mechanical damage received by the first and second electronic components 30 and 40 in the process of bonding the first and second electrodes 35a and 35b.

Moreover, since the first and second electrodes 35a and 35b can be bonded in a short time, it is possible to increase the throughput of the process of manufacturing the electronic devices and reduce the power consumption at manufacturing the same, thereby reducing the environmental burdens.

Moreover, the organic acid metal film 2 and altered layer 3 can be formed in a dry atmosphere. Accordingly, it is unnecessary to prepare a wet-type manufacturing apparatus, and electronic devices can be manufactured through a simple process.

Note that the first embodiment is not limited to the above description. For example, the altered layers 3 are formed in both of the first and second electrodes 35a and 35b in the above description. However, the altered layers 3 may be formed only in the first electrodes 35a or only in the second electrodes 35b.

Furthermore, although the first electronic component 30 is a circuit board and the second electronic component 40 is a semiconductor device, the electronic components to be bonded are not limited to this combination. For example, the first electronic components, which are the circuit boards, may be bonded with each other. Alternatively, the second electronic components, which are the semiconductor elements, may be bonded with each other. This is also the case in the following embodiments.

Furthermore, in the example of FIG. 3, all of the chambers 21, 24, and 26 and the flip-chip bonder 25 are connected through the transfer units 23a to 23c. However, all of the chambers 21, 24, and 26 and the flip-chip bonder 25 are not necessarily connected. For example, the first and second electronic components 30 and 40 may be exposed to an air after being temporarily bonded to each other in the flip-chip bonder 24 and before being transferred to the third chamber 26. When the exposure time thereof does not exceed 10 hours, the bond strength between the first and second electronic components 30 and 40 cannot degrade, thereby avoiding the influence on the reliability of the electronic components.

Second Embodiment

In the first embodiment, the oxidized film 1 (FIG. 4B) is used to form the altered layer 3 (FIG. 4F) of amorphous or microcrystalline copper.

In a second embodiment, machining is used to thicken the altered layer than in the first embodiment.

FIGS. 6A to 6D are cross-sectional views of an electronic device in process of manufacture according to the second embodiment. In FIGS. 6A to 6D, the same elements as those described in the first embodiment are given the same reference numerals, and the description thereof is omitted below.

Figure 6A:
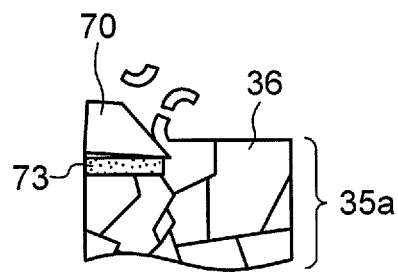
FIGS. 6A to 6D are cross-sectional views of an electronic device in process of manufacture according to a second embodiment.

First, as illustrated in FIG. 6A, the surface of the first electrode 35a is cut by a diamond tool bit 70 to form an altered layer 73 of amorphous or microcrystalline copper in the surface of the first electrode 35a.

In this embodiment, the surface of the first electrode 35a is cut under the conditions where the diamond tool bit 70 rotates at a circumferential speed of 15 m/sec to 20 m/sec, for example, and the diamond tool bit 70 moves in the lateral direction of the substrate about 20 μm per rotation.

Figure 6B:
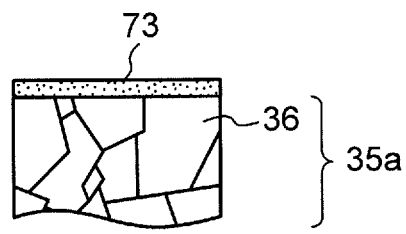

Such machining disturbs copper crystals in the surface of the first electrode 35a. Therefore, as illustrated in FIG. 6B, the altered layer 73 of copper not having a crystalline structure is formed in a depth ranging from 100 nm to 200 nm from the surface of the first electrode 35a.

Figure 6C:
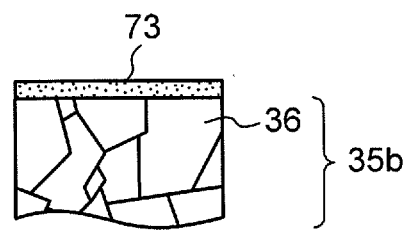

Using the same method, the altered layer 73 of copper is formed in the surface layer of the second electrode 35b as illustrated in FIG. 6C.

Figure 6D:
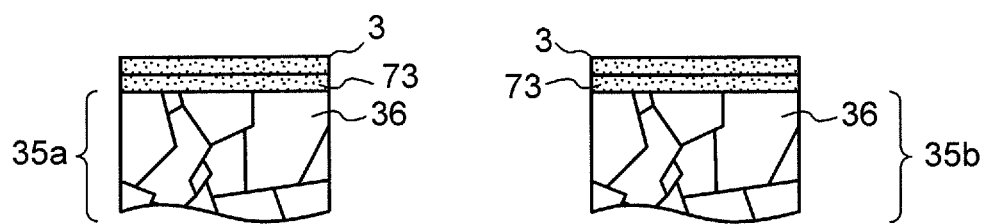

Then, the processes of FIGS. 4A to 4F described in the first embodiment are performed to obtain the cross-sectional structure illustrated in FIG. 6D. As illustrated in FIG. 6D, in each of the first and second electrodes 35a and 35b, the altered layer 3, which is obtained from the organic acid metal film 2 by UV irradiation (see FIG. 4E), is formed on the altered layer 73 obtained by the aforementioned machining.

Thereafter, the processes of FIGS. 4I to 4K of the first embodiment are performed to complete the basic structure of the electronic device illustrated in FIG. 5.

According to the present embodiment described above, by forming the altered layer 73 of copper by machining, the altered layer 73 can be entirely made thicker than that of the first embodiment in which the altered layer 3 of copper is formed from the oxidized film 1. Accordingly, the altered layers can deform more flexibly in the process of bonding the first and second electrodes 35a and 35b. Due to such soft altered layers 3 and 73, the first and second electrodes 35a and 35b can come into close contact in a better manner.

Next, the experiment results of the present embodiment are described.

The experiment is performed to examine die shear strength of the electronic device 59 manufactured in the present embodiment (see FIG. 5). The die shear strength is defined as the maximum force that is applied to the second electronic component 40 in the lateral direction of the substrate when the first and second electrodes 35a and 35b are peeled from the interface between the first and second electrodes 35a and 35b.

Figure 7:
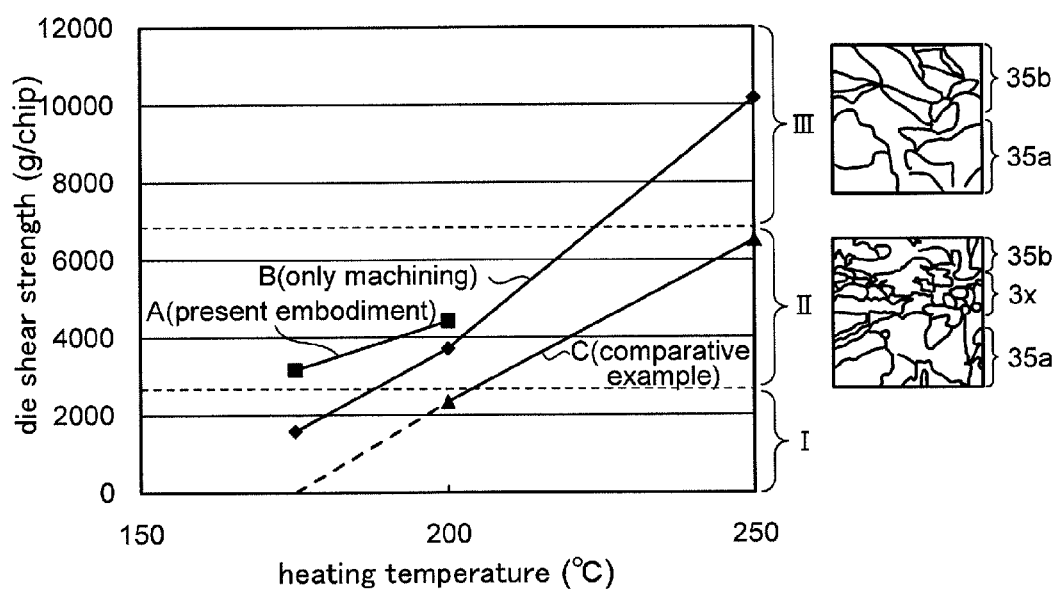
FIG. 7 is a view for explaining experiment results in the second embodiment.

The experiment results are illustrated in FIG. 7.

In FIG. 7, the horizontal axis indicates heating temperature of the first and second electrodes 35a and 35b in the process of FIG. 4J. The vertical axis in FIG. 7 indicates the aforementioned die shear strength.

Graph A in FIG. 7 represents the experiment results obtained in the present embodiment. Graph B in FIG. 7 represents the experiment results in the case where only the machining illustrated in FIG. 6A is performed and the altered layer 3 derived from the oxidized film 1 of FIG. 6D is not formed. Graph C in FIG. 7 represents the experiment results of a comparative example where the first and second electrodes 35a and 35b are directly bonded without performing machining (FIG. 6A) and without formation of the altered layers 3 (FIG. 6D).

The aforementioned die shear strength depends on the state of the interfaces between the first and second electrodes 35a and 35b.

For example, in the Region I where the die shear strength is as small as about 0 g/chip to 3000 g/chip, there are clear interfaces between the first and second electrodes 35a and 35b, and hence the bond strength between the first and second electrodes 35a and 35b is low.

In the Region II where the die shear strength is 3000 g/chip to 7000 g/chip, the interfaces between the electrodes disappear, and the first and second electrodes 35a and 35b are substantially merged. However, in the Region II, the die shear strength is not high enough for the electrodes to be considered completely merged. Thus, between the electrodes, the previously described crystal layers 3x are formed.

On the other hand, in the Region III where the die shear strength is about 7000 g/chip to 12000 g/chip, the first and second electrodes 35a and 35b are substantially completely merged, and the crystal layers 3x do not exist therebetween.

As illustrated in FIG. 7, comparing the graphs at the same bonding temperature, the die shear strength of Graph C of the comparative example is the smallest.

As for the Graph B with only machining, the die shear strength is higher than that of the comparative example but is not high enough at a bonding temperature of 175° C.

On the other hand, in the Graph A of the present embodiment, the die shear strength at a bonding temperature of 175° C. is about twice as that of the case of only machining.

Accordingly, it can be confirmed that the combination of machining and UV irradiation as in the present embodiment is effective on an increase in bond strength at a low bonding temperature of about 175° C. Since the bond strength is high enough at low bonding temperature of about 175° C. in this manner, the first and second electrodes 35a and 35b can be bonded without being heated to high temperature in the present embodiment. Thus, the first and second electronic components 30 and 40 are less likely to be damaged by heat.

Third Embodiment

In the first embodiment, as illustrated in FIG. 3, the first chamber 21 for exposure to organic acid and the second chamber 24 for UV irradiation are used.

On the other hand, in a the present embodiment, a description is given of an electronic device manufacturing apparatus in which the first and second electronic components 30 and 40 can be exposed to organic acid and ultraviolet light in a single chamber.

Figure 8:
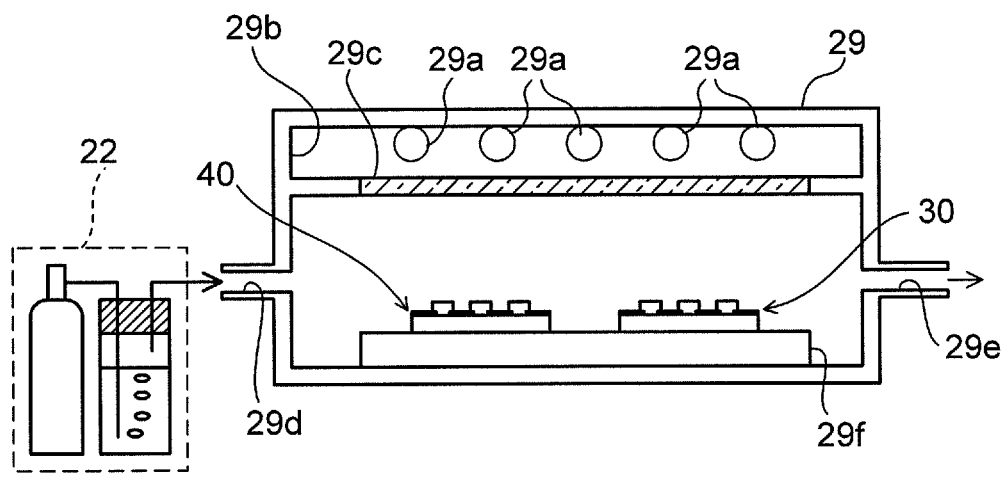
FIG. 8 is a cross-sectional view of an electronic device manufacturing apparatus according to a third embodiment.

FIG. 8 is a cross-sectional view of the electronic device manufacturing apparatus according to the present embodiment.

As illustrated in FIG. 8, an electronic device manufacturing apparatus 60 of the present embodiment includes a chamber 29 and a stage 29f accommodated in the chamber 29. Above the stage 29f, a window 29c made of heat-resistant glass is provided. The chamber 29 is partitioned by this window 29c into two compartments. Among these two compartments, the compartment above the window 29c is used as an accommodation section 29b accommodating ultraviolet lamps 29a.

On the other hand, the compartment below the window 29c is provided with a gas inlet 29d, which is connected to the organic acid supply unit 22, and a gas outlet 29e. The stage 29f includes an unillustrated heater and is capable of heating the first and second electronic components 30 and 40 to a predetermined temperature.

In the electronic device manufacturing apparatus 60, each of the first and second electronic components 30 and 40 are exposed to organic acid, such as formic acid, which is supplied through the gas inlet 29d to form the organic acid metal film 2 (see FIG. 4C).

Furthermore, the organic acid metal film 2 is irradiated with ultraviolet light from the ultraviolet lamps 29a to form the altered layer 3 of amorphous or microcrystalline copper (see FIG. 4F).

In this manner, each of the first and second electronic components 30 and 40 can be exposed to ultraviolet light and organic acid in the single chamber 29 in the present embodiment. Therefore, the apparatus configuration of the present embodiment can be made simpler than that of the first embodiment.

Furthermore, use of only the single chamber 29 in such a manner eliminates the need to transfer the first electronic component 30 and the like from the first chamber 21 for exposure to organic acid to the second chamber 24 for ultraviolet irradiation like in the first embodiment, and hence the transfer time can be reduced.

Moreover, the accommodation section 29b is separated from the stage 29f by the window 29c. This can eliminate the risk that radiation heat from the stage 29f could damage the ultraviolet lamps 29a. Accordingly, the temperature of the stage 29f can be set higher than in the case where the window 29c is absent. Therefore, the first and second electronic components 30 and 40 can be irradiated with ultraviolet light in a wide range of temperature.

Note that the stage 29f may be provided with an unillustrated elevation mechanism so that the distance between the first electronic component 30 and the ultraviolet lamps 29a or between the second electronic component 40 and the ultraviolet lamps 29a can be adjustable. In this case, by adjusting the above distances so as to maximize the intensity of ultraviolet light irradiating the first and second electronic components 30 and 40, the electronic components 30 and 40 can be efficiently irradiated with ultraviolet light.

Fourth Embodiment

In a fourth embodiment, the first and second electronic components 30 and 40 are fixed to each other by a temporary bonding material in the following manner.

Figure 9:
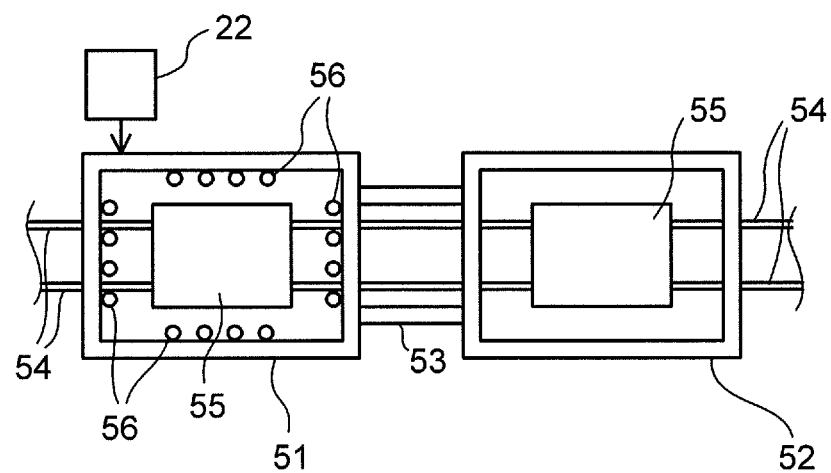
FIG. 9 is a plan view of an electronic device manufacturing apparatus according to a fourth embodiment.

FIG. 9 is a plan view of an electronic device manufacturing apparatus used in the fourth embodiment.

As illustrated in FIG. 9, an electronic device manufacturing apparatus 50 of the present embodiment includes a first chamber 51 and a second chamber 52.

Through the first and second chambers 51 and 52, a pair of transfer rails 54 is inserted. On the transfer rails 54, a stage 55 movable in the extending direction of the rails 54 is provided.

The first chamber 51 includes ultraviolet lamps 56 on the side surface thereof and is connected to the organic acid supply unit 22.

Note that, on the side surface of each of the first and second chambers 51 and 52, an unillustrated valve through which the stage 55 can go in and out is provided. The valves maintain the air tightness within the first and second chambers 51 and 52.

Figure 10:
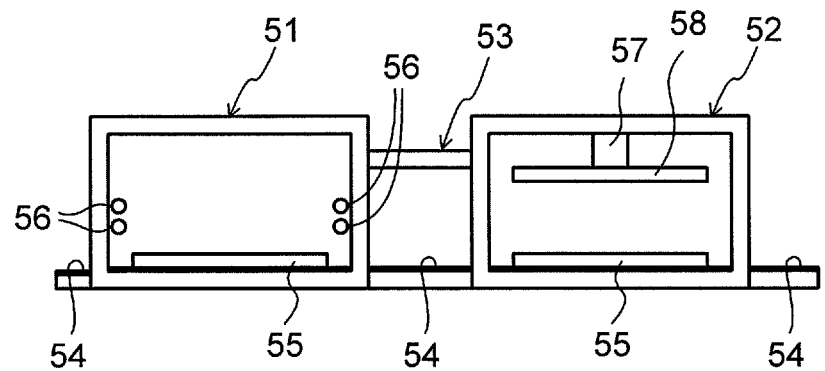
FIG. 10 is a cross-sectional view of the electronic device manufacturing apparatus according to the fourth embodiment.

FIG. 10 is a cross-sectional view of the electronic device manufacturing apparatus illustrated in FIG. 9.

As illustrated in FIG. 10, the second chamber 52 includes a press plate 58 and a press unit 57. The press unit 57 is expandable. The press plate 58 moves up and down by the expansion movement of the press unit 57.

Between the first and second chambers 51 and 52, a connection unit 53 is provided. The inside of the connection unit 53 is made airtight. Accordingly, the electronic components placed on the stage 55 can be moved from the first chamber 51 to the second chamber 52 without being exposed to the air.

Hereinafter, a description is given of the method of manufacturing an electronic device using the manufacturing apparatus 50.

FIGS. 11A to 11G are cross-sectional views of an electronic device according to the present embodiment in process of manufacture. In FIGS. 11A to 11G, the same elements as those described in the first embodiment are given the same reference numerals as those of the first embodiment, and the description thereof is omitted below.

Figure 11A:
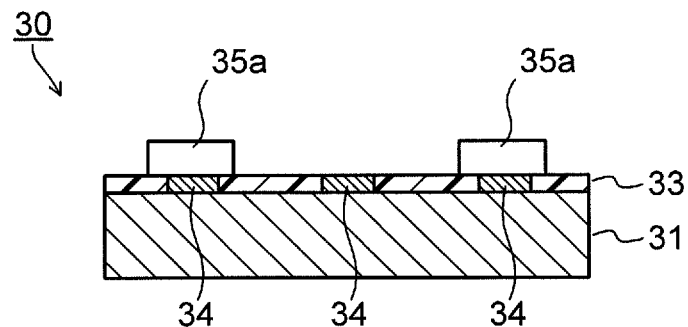
FIGS. 11A to 11G are cross-sectional views illustrating a method of manufacturing an electronic component according to the fourth embodiment.
Figure 11B:
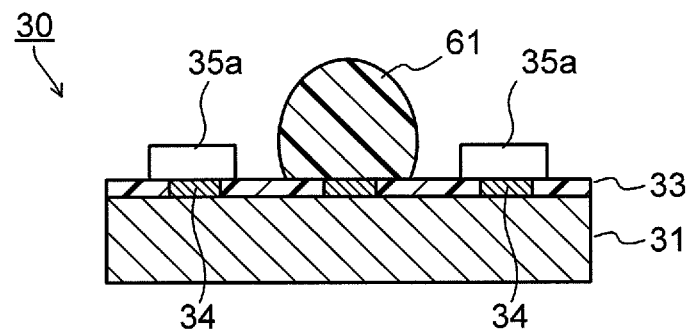

First, after the first electronic component 30 is prepared as illustrated in FIG. 11A, a temporary bonding material 61 is attached to the surface of the first electronic component 30 as illustrated in FIG. 11B.

The material of the temporary bonding material 61 is not particularly limited, but is preferably a material which volatilizes, melts, or decomposes by heat to generate stickiness. Examples of such a material include polyethylene glycol (PEG2000) with a molecular weight of about 2000. Polyethylene glycol has a melting point of about 50° C. and is a solid at room temperature. However, when being heated to partially melt, polyethylene glycol can adhere to the first electronic component 30.

Moreover, instead of polyethylene glycol, the temporary bonding material 61 may be any one of the group consisting of polypropylene glycol, butyl carbitol acetate, polyester, and polyhydroxy polyether. Alternatively, the temporary bonding material 61 may be a copolymer composed of ethylene and either one of polysulfonic acid and vinyl acetate. Moreover, the temporary bonding material 61 may be any one of the group consisting of acetic anhydride, succinic anhydride, and methyl acrylate, which volatilizes at a temperature of about 100° C. to 200° C. Furthermore, the temporary bonding material 61 may be methyl methacrylate or ethyl methacrylate which easily decomposes at a temperature of about 100° C.

In light of the productivity, it is preferable that the temporary bonding material 61 be applied before the first electronic component 30 is cut out of a wafer by dicing.

Figure 11C:
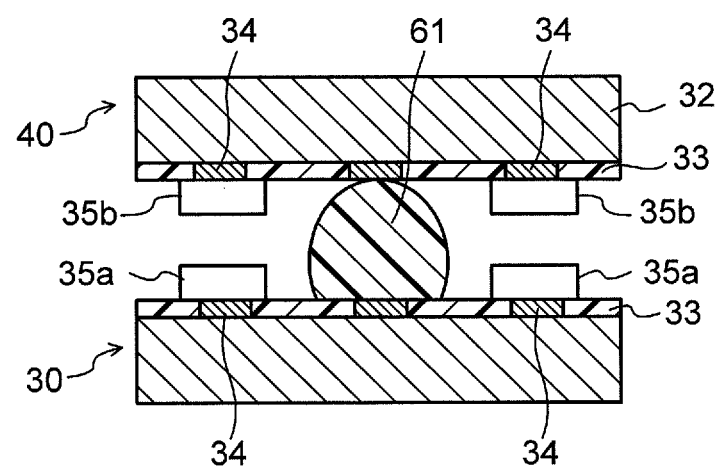

Thereafter, as illustrated in FIG. 11C, an unillustrated flip-chip bonder is used to place the second electronic component 40 over the first electronic component 30, and the first and second electrodes 35a and 35b are aligned with each other.

Then, using heat from the flip-chip bonder, the second electronic component 40 is heated at 120° C. for 15 sec, for example, to melt the temporary bonding material 61. Thus, the first and second electronic components 30 and 40 are temporarily bonded, while the gaps are made between the first and second electrodes 35a and 35b.

Figure 11D:
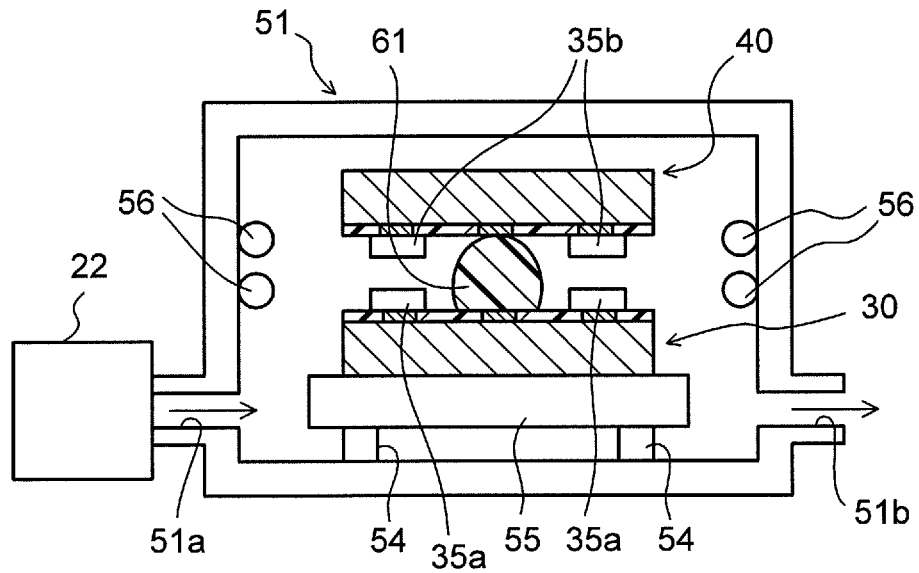

Next, as illustrated in FIG. 11D, the first and second electronic components 30 and 40 are placed on the stage 55 and are transferred into the first chamber 51.

Then gas containing organic acid such as formic acid is introduced into the first chamber 51 through the gas inlet 51a. The top surfaces of the first and second electrodes 35a and 35b are thus exposed to the organic acid. Thus, the naturally-oxidized films and organic acid are reacted with each other in the surfaces of the first and second electrodes 35a and 35b to form the organic acid metal films 2 (see FIG. 4C).

Next, the introduction of the gas containing the organic acid is stopped, and the gas in the chamber 51 is discharged from the gas outlet 51b.

Figure 11E:
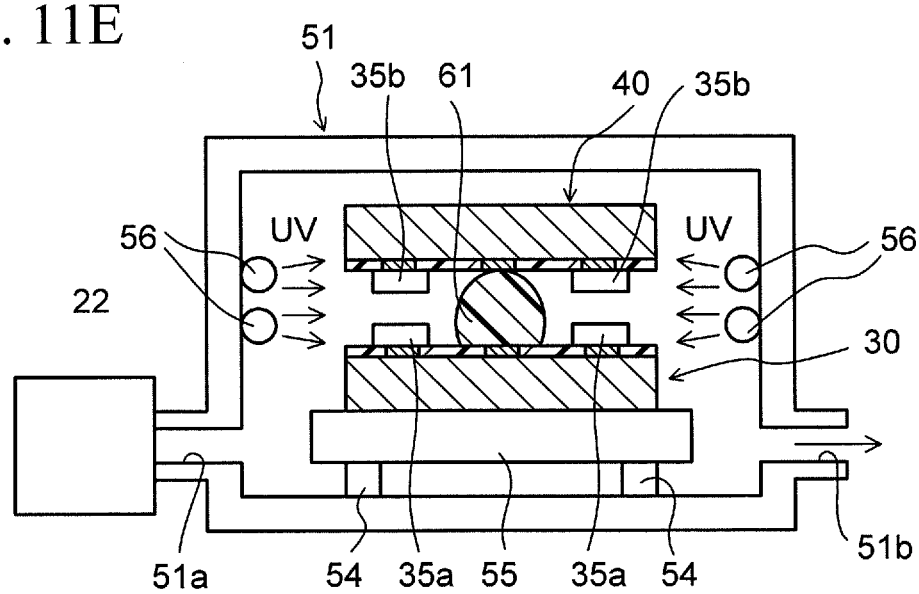

Then, as illustrated in FIG. 11E, the top surfaces of the first electrodes 35a and 35b are irradiated with ultraviolet light generated by the ultraviolet lamps 56 provided beside the first and second electrodes 35a and 35b, thus forming the altered layers 3 (see FIG. 4F) of copper in the top surfaces of the first and second electrodes 35a and 35b.

In the present embodiment, the ultraviolet lamps 56 are provided on the side surface of the first chamber 51 as described above. Accordingly, the ultraviolet light generated by the ultraviolet lamps 56 enters the gaps between the first and second electrodes 35a and 35b, and hence the top surfaces of the first and second electrodes 35a and 35b can be surely irradiated with ultraviolet light.

Note that the stage 55 may include an unillustrated rotation mechanism and elevation mechanism and, by driving these mechanisms, the top surfaces of the first and second electrodes 35a and 35b may evenly be irradiated with ultraviolet light.

Figure 11F:
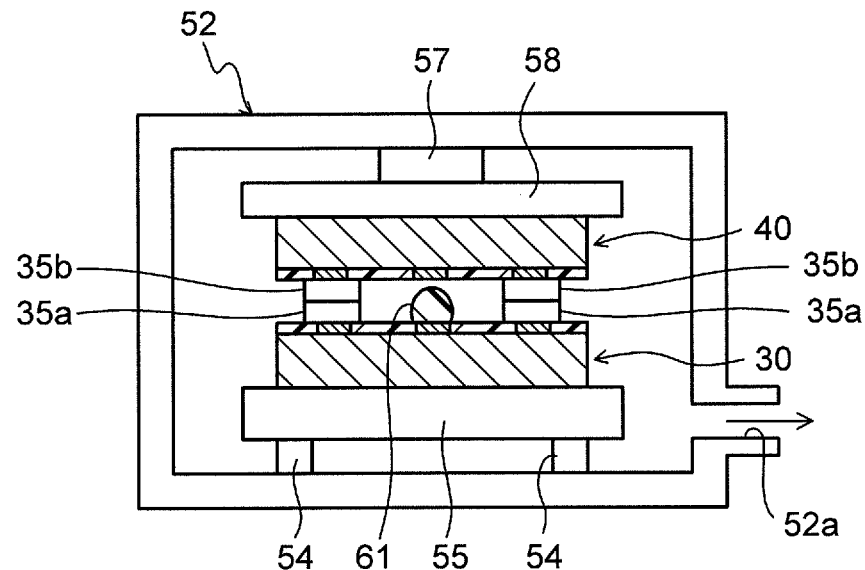

Next, as illustrated in FIG. 11F, the stage 55 is moved along the transfer rails 54 to move the first and second electronic components 30 and 40 in the second chamber 52.

Then, the second electronic component 40 is pressed by the press plate 58, while the first and second electrodes 35a and 35b are heated at a temperature lower than 130° C. which is the recrystallization temperature of the altered layers 3 (see FIG. 4H). Thus, the first and second electrodes 35a and 35b are temporarily bonded. Note that this heating can be performed by an unillustrated heater incorporated in the press plate 58 or stage 55.

Thereafter, while keeping the press plate 58 in the state of pressing, the heating temperature of the heater is increased to heat the first and second electronic components 30 and 40 to 170° C., thus polyethylene glycol of the temporary bonding material 61 is volatized and removed.

Figure 11G:
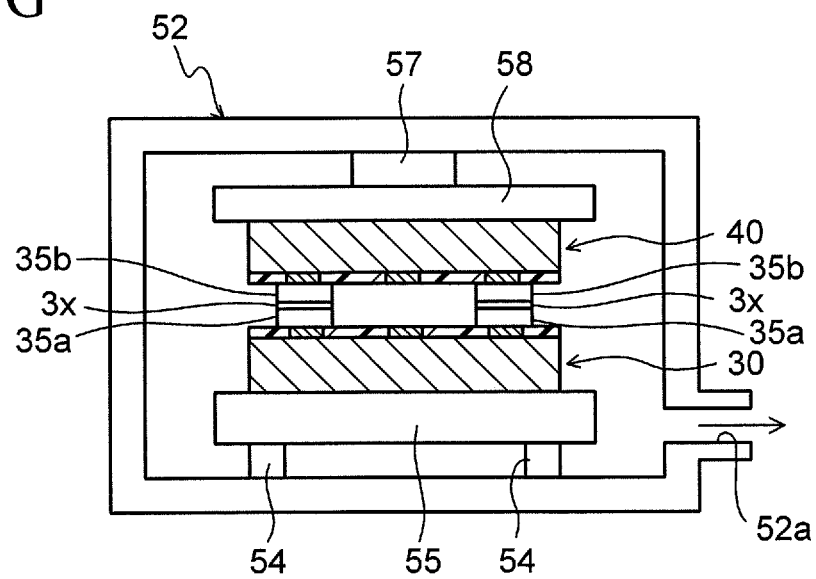

As illustrated in FIG. 11G, while continuing the pressing by the press plate 58, the first and second electronic components 30 and 40 are heated to 150 to 250° C. This state is held for about 30 min to crystallize the altered layers 3 (see FIG. 4H), thereby bonding the first and second electrodes 35a and 35b. Thus, the electronic device 59 illustrated in FIG. 5 is completed.

According to the present embodiment described above, while temporary bonding the first and second electronic components 30 and 40, the first and second electronic components 30 and 40 are exposed to organic acid and ultraviolet light. Accordingly, the electronic devices can be manufactured more efficiently than the case where the first and second electronic components 30 and 40 are individually subjected to the organic acid and ultraviolet light.

Furthermore, since the inside of the connection unit 53 (see FIG. 10) is maintained airtight, the copper altered layers 3 can be prevented from being exposed to the air on the way from the first chamber 51 to the second chamber 52. Therefore, it is possible to inhibit re-oxidation of the altered layers 3, thereby preventing reduction in bond strength between the first and second electrodes 35a and 35b due to oxidization.

Although the material volatilized by heat is used as the temporary bonding material 61 in the above, epoxy resin paste or epoxy resin film may be used as the temporary bonding material 61. In this case, the temporary bonding material 61 does not volatilize by heat and can be left as a part of underfill resin.

Fifth Embodiment

In the fourth embodiment, the first and second chambers 51 and 42 are used as illustrated in FIGS. 9 and 10. In contrast, in the present embodiment, a description is given of an electronic device manufacturing apparatus in which the functions of these two chambers is unified.

Figure 12:
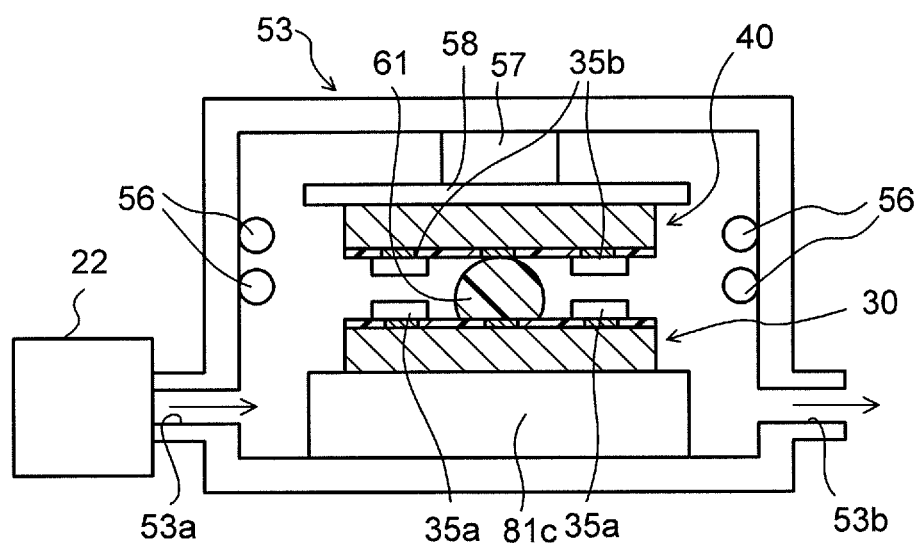
FIG. 12 is a cross-sectional view of an electronic device manufacturing apparatus according to a fifth embodiment.

FIG. 12 is a cross-sectional view of the electronic device manufacturing apparatus according to the present embodiment. In FIG. 12, the same elements as those described in the fourth embodiment are given the same reference numerals as those of the fourth embodiment, and the description thereof is omitted.

A manufacturing apparatus 80 includes a chamber 53 provided with the ultraviolet lamps 56, the press unit 57, and the press plate 58. The chamber 53 is supplied with the gas containing organic acid such as formic acid from the organic acid supply unit 22 through a gas inlet 53a.

Furthermore, in the chamber 53, a stage 81c, on which the first electronic component 30 is placed, is provided.

According to this, the plural of processes such as supply of organic acid, irradiation of ultraviolet light, and pressing of the second electronic component 40 against the first electronic component 30 can be performed in the single manufacturing apparatus 80, and hence the apparatus configuration can be simplified.

Sixth Embodiment

In the first embodiment, the first and second electrodes 35a and 35b are made of copper. In the present embodiment, tin layers are formed on the electrodes 35a, 35b in advance.

FIGS. 13A to 13E are cross-sectional views in process of manufacturing the electronic device according to the sixth embodiment. In FIGS. 13A to 13E, the same elements as those described in the first embodiment are given the same reference numerals as those of the first embodiment, and the description thereof is omitted.

Figure 13A:
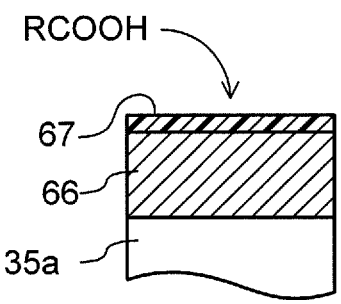
FIGS. 13A to 13E are cross-sectional views of an electronic device according to a sixth embodiment.

First, as illustrated in FIG. 13A, a low-melting point metal layer, such as a tin layer 66, is formed on the top surface of each first electrode 35a by plating to a thickness of about 2 to 5 μm. When the tin layer 66 is left in the air, an oxidized film 67 containing SnO or $SnO_2$ is formed in the surface of the tin layer 66.

Figure 13B:
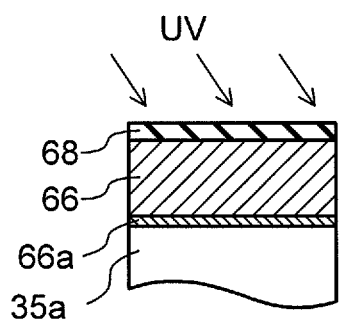

Next, as illustrated in FIG. 13B, the top surface of the tin layer 66 is exposed to organic acid. Here, formic acid is used as the organic acid. Then, an oxidized film 67 is reacted with the formic acid at a temperature of about 120° C. for about 30 min. Thus, the naturally oxidized film 67 formed in the surface of the tin layer 66 reacts in accordance with either chemical formula (4) or chemical formula (5) in the following.

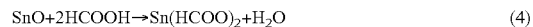
$$SnO + 2HCOOH \rightarrow Sn(HCOO)_2 + H_2O \quad (4)$$

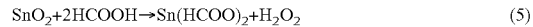
$$SnO_2 + 2HCOOH \rightarrow Sn(HCOO)_2 + H_2O_2 \quad (5)$$

By these reactions, an organic acid metal film 68 containing tin formate is formed on the top surface of the first electrode 35a. Note that due to the heating in this process, an intermetallic compound ($Cu_6Sn_5$) layer 66a made of tin and copper is formed in the interface between the first electrode 35a made of copper and the tin layer 66.

Next, the surface of the organic acid metal film 68 is irradiated by ultraviolet light. Thus, the organic acid metal film 68 is decomposed in accordance with the following reaction formula (6).

$$Sn(HCOO)_2 \rightarrow Sn + CO + CO_2 + H_2 \quad (6)$$

Figure 13C:
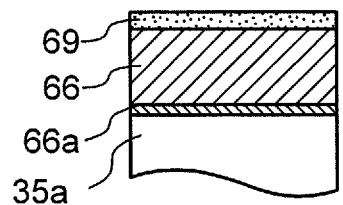

Tin produced by the above reaction forms an altered layer 69 of amorphous or microcrystalline tin not having a crystalline structure as illustrated in FIG. 13C.

The similar process as the aforementioned process is also performed for the second electrode 35b, thereby forming the tin altered layer 69 in the top surface of the second electrode 35b.

Figure 13D:
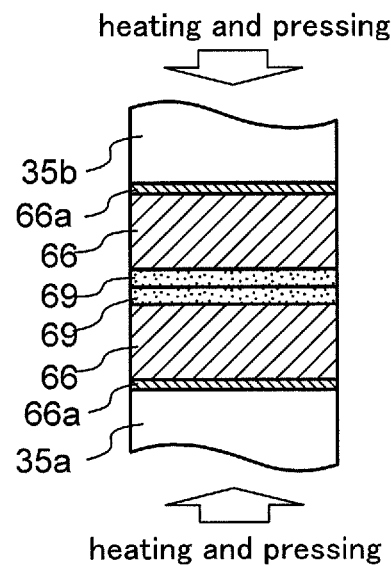

Next, as illustrated in FIG. 13D, after the first and second electronic components 30 and 40 are aligned by an unillustrated flip-chip bonder, the first and second electronic components 30 and 40 are heated and pressed against each other. Herein, the first and second electronic components 30 and 40 are pressed and heated at a temperature of 150° C. for 5 min.

Figure 13E:
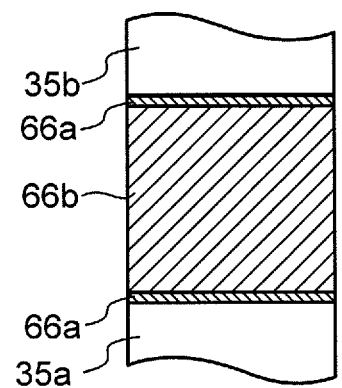

Accordingly, as illustrated in FIG. 13E, the altered layers 69 are crystallized, and the tin layers 66 are merged with each other, thus bonding the first and second electrodes 35a and 35b to each other. Note that due to the heating in this process, the intermetallic compound layers 66a grow thicker.

In such a manner, the basic structure of the electronic device 59 illustrated in FIG. 5 is completed.

According to the present embodiment, the first and second electrodes 35a and 35b are bonded via the altered layers 69 of tin, which is a low-melting point metal. Accordingly, the first and second electrodes 35a and 35b can be bonded to each other in a shorter time at a lower temperature than in the first embodiment using the altered layers 3 of copper (see FIG. 4J). This can further reduce damage on the first and second electronic components 30 and 40.

Note that the present embodiment is not limited to the above example. Although the tin layers 66 are formed on both the first and second electrodes 35a and 35b in the above, the tin layers 66 may be formed only in the first electrodes 35a or only in the second electrodes 35b.

According to the above embodiments, the top surface of the first electrode exposed to the organic acid is irradiated with ultraviolet light to form the altered layer composed of an amorphous layer, microcrystalline layer, or the like. The first and second electrodes are then bonded with the altered layer interposed therebetween. The altered layer has the lower recrystallization temperature and is softer than the crystalline layer. It is therefore possible to reduce the temperature and load applied in the process of bonding the first and second embodiments, thus reducing damage on the first and second electronic components.

All examples and conditional language provided herein are intended for the pedagogical purpose of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention has been described in detail, it should be understood that the various changes, substitutions, and alterations could be made hereto without departing from the spirit and scope of the invention.

What is claimed is:

1. An electronic device, comprising:
    a first electronic component including a first electrode consisting of copper; and
    a second electronic component including a second electrode bonded to the first electrode, the second electrode consisting of copper, wherein
    a crystal layer consisting of copper is formed between the first electrode and the second electrodes,
    crystal grains of the crystal layer have an average diameter smaller than average diameters of crystal grains of the first electrode and the second electrode, and
    in any one of interfaces, the interfaces being the one between the first electrode and the a plurality of interfaces, crystal layer and the one between the second electrode and the crystal layer, orientations of the copper crystalline grains are discontinuous.

* * * * *

UNITED STATES PATENT AND TRADEMARK OFFICE
CERTIFICATE OF CORRECTION

PATENT NO. : 8,922,027 B2  
APPLICATION NO. : 13/671970  
DATED : December 30, 2014  
INVENTOR(S) : Taiji Sakai et al.

Page 1 of 1

It is certified that error appears in the above-identified patent and that said Letters Patent is hereby corrected as shown below:

On the title page correct item (56) References Cited to include the following under each section:

U.S. PATENT DOCUMENTS  
US2011/0045653   02/2011   Ohno et al

FOREIGN PATENT DOCUMENTS  
CN102017819A   04/2011

OTHER PUBLICATIONS  
Chinese Office Action dated October 10, 2014 in the corresponding Chinese patent application number 2014093001251320, with English translation.

Signed and Sealed this  
Sixteenth Day of June, 2015

Michelle K. Lee  
*Director of the United States Patent and Trademark Office*